United States Patent
Chen et al.

(10) Patent No.: US 10,403,977 B2
(45) Date of Patent: Sep. 3, 2019

(54) WIRELESS COMMUNICATION DEVICE

(71) Applicant: Wistron NeWeb Corp., Hsinchu (TW)

(72) Inventors: Yung-Jinn Chen, Hsinchu (TW); Yu-Meng Yen, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 0 days.

(21) Appl. No.: 15/974,702

(22) Filed: May 9, 2018

(65) Prior Publication Data
US 2019/0181550 A1 Jun. 13, 2019

(30) Foreign Application Priority Data
Dec. 8, 2017 (TW) .............................. 106143076 A

(51) Int. Cl.
| | |
|---|---|
| H01Q 5/335 | (2015.01) |
| H03F 1/56 | (2006.01) |
| H04B 1/04 | (2006.01) |
| H03H 7/40 | (2006.01) |
| H03H 7/38 | (2006.01) |

(52) U.S. Cl.
CPC ............. *H01Q 5/335* (2015.01); *H03F 1/565* (2013.01); *H03H 7/40* (2013.01); *H04B 1/0458* (2013.01); *H03H 2007/386* (2013.01)

(58) Field of Classification Search
CPC ............. H01Q 5/335; H03F 1/56; H03H 7/40
USPC ........................................................ 343/745
See application file for complete search history.

(56) References Cited

U.S. PATENT DOCUMENTS

2008/0211729 A1* 9/2008 Eriksson .................. H01P 1/127
343/876
2017/0070246 A1* 3/2017 Natesan ............... H04B 1/0458

FOREIGN PATENT DOCUMENTS

| TW | 201336167 | 9/2013 |
|---|---|---|
| TW | 201715791 | 5/2017 |
| WO | 2012037892 | 3/2012 |

OTHER PUBLICATIONS

Office Action of Taiwan Counterpart Application, dated Nov. 8, 2018, pp. 1-12.

* cited by examiner

*Primary Examiner* — Andrea Lindgren Baltzell
(74) *Attorney, Agent, or Firm* — JCIPRNET

(57) ABSTRACT

A wireless communication device includes a first antenna, a second antenna, a first switching circuit, and a first tunable matching circuit. The first switching circuit is electrically connected to the first antenna, the second antenna, and the first tunable matching circuit. In a first operation mode, the first antenna of the wireless communication device performs signal transmission or reception, an impedance value corresponding to the first tunable matching circuit is adjusted to a first impedance value, and the second antenna is conducted to the first tunable matching circuit through the first switching circuit. In a second operation mode, the second antenna of the wireless communication device performs signal transmission or reception, the impedance value corresponding to the first tunable matching circuit is adjusted to a second impedance value, and the first antenna is conducted to the first tunable matching circuit through the first switching circuit.

19 Claims, 5 Drawing Sheets

WIRELESS COMMUNICATION DEVICE

CROSS-REFERENCE TO RELATED APPLICATION

This application claims the priority benefit of Taiwan application serial no. 106143076, filed on Dec. 8, 2017. The entirety of the above-mentioned patent application is hereby incorporated by reference herein and made a part of this specification.

BACKGROUND OF THE INVENTION

Field of the Invention

The disclosure relates to a wireless communication device, and in particular, to a wireless communication device including antennas.

Description of Related Art

Generally, a wireless communication device uses a radio frequency switch to switch between two or more antennas to select one of the antennas for use, and the rest of the un-used antennas remain in a floating state. However, in actual operation, although the rest of the un-used antennas are not operating, the antennas in the floating state (i.e., the un-used antennas) generally cause impact on the in-use antenna and thus reduce performance of the in-use antenna. Particularly, when the antennas are positioned close to each other or have undesirable isolation, the un-used antennas generally deteriorate the performance of the in-use antenna, which reduces communication quality of the wireless communication device.

SUMMARY OF THE INVENTION

The embodiments of the invention provide a wireless communication device that uses a tunable matching circuit to reduce impact caused by all un-used antenna(s) on an in-use antenna. Accordingly, performance of the in-use antenna is improved, which enhances communication quality of the wireless communication device.

A wireless communication device according to an embodiment of the invention includes a first antenna, a second antenna, a first switching circuit, and a first tunable matching circuit. The first switching circuit is electrically connected to the first antenna and the second antenna. The first tunable matching circuit is electrically connected to the first switching circuit. In a first operation mode, the first antenna of the wireless communication device performs signal transmission or reception, an impedance value corresponding to the first tunable matching circuit is adjusted to a first impedance value, and the second antenna is conducted to the first tunable matching circuit through the first switching circuit. In a second operation mode, the second antenna of the wireless communication device performs signal transmission or reception, the impedance value corresponding to the first tunable matching circuit is adjusted to a second impedance value, and the first antenna is conducted to the first tunable matching circuit through the first switching circuit.

A wireless communication device according to an embodiment of the invention includes a first switching circuit, a first antenna, a first tunable matching circuit, a second switching circuit, a second antenna, and a second tunable matching circuit. The first antenna and the first tunable matching circuit are electrically connected to the first switching circuit. The second antenna and the second tunable matching circuit are electrically connected to the second switching circuit. In a first operation mode, the first antenna of the wireless communication device performs signal transmission or reception, an impedance value corresponding to the second tunable matching circuit is adjusted to a first impedance value, and the second antenna is conducted to the second tunable matching circuit through the second switching circuit. In a second operation mode, the second antenna of the wireless communication device performs signal transmission or reception, an impedance value corresponding is adjusted to the first tunable matching circuit to a second impedance value, and the first antenna is conducted to the first tunable matching circuit through the first switching circuit.

Accordingly, the wireless communication device of the embodiments of the invention uses the switching circuit(s) to select part of the antennas for use, and uses the switching circuit(s) to conduct the un-used antenna(s) to the tunable matching circuit. Therefore, performance of the in-use antenna is improved, which enhances communication quality of the wireless communication device.

To provide a further understanding of the aforementioned and other features and advantages of the disclosure, exemplary embodiments, together with the reference drawings, are described in detail below.

DESCRIPTION OF THE EMBODIMENTS

Figure 1:
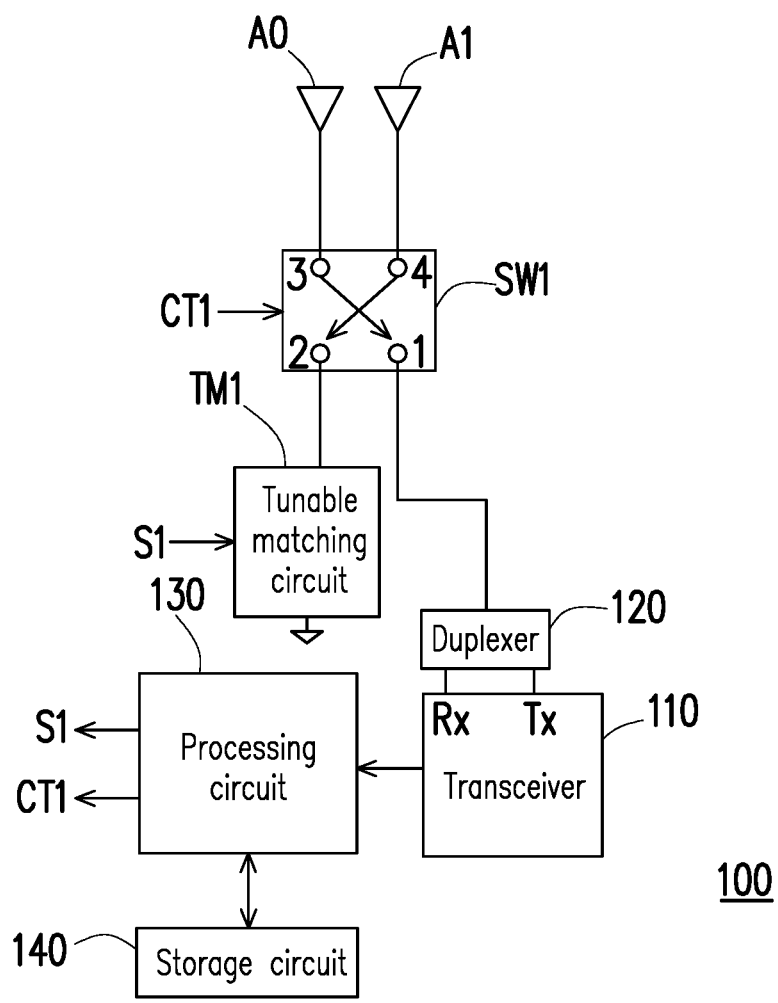
FIG. 1 is a schematic diagram illustrating a wireless communication device according to an embodiment of the invention.

FIG. 1 is a schematic diagram illustrating a wireless communication device according to an embodiment of the invention. As shown in FIG. 1, a wireless communication device 100 includes a switching circuit SW1, an antenna A0, an antenna A1, and a tunable matching circuit TM1. Specifically, the switching circuit SW1 is electrically connected to the antenna A0, the antenna A1, and the tunable matching circuit TM1. The antenna A0 is, for example, an external antenna, and the antenna A1 is, for example, a built-in antenna. In another embodiment, the antenna A0 and the antenna A1 may also respectively be a built-in antenna or an external antenna. The switching circuit SW1 is, for example, a double pole double throw (DPDT) radio frequency switch.

In operation, the wireless communication device 100 uses the switching circuit SW1 to select one of the antenna A0 and the antenna A1 for use, and the un-used antenna is conducted to the tunable matching circuit TM1 through the switching circuit SW1. For example, in a first operation mode, the wireless communication device 100 uses the antenna A0 to perform signal transmission or reception (namely, using the antenna A0 to perform signal transceiving operations) and adjusts an impedance value corresponding to the tunable matching circuit TM1 to a first impedance value (e.g., 50 Ohm), and the antenna A1 is conducted to the tunable matching circuit TM1 through the switching circuit SW1. Accordingly, when the antenna A0 transmits or receives signals, the wireless communication device 100 uses the tunable matching circuit TM1 to adjust a load impedance of the un-used antenna A1 and improves performance of the in-use antenna A0 by changing the load impedance of the un-used antenna A1. For example, the wireless communication device 100 enables the antenna A0 to exhibit better total radiation power and total isotropic sensitivity by adjusting the load impedance of the antenna A1.

On the other hand, in a second operation mode, the wireless communication device 100 uses the antenna A1 to perform signal transmission or reception (namely, using the antenna A1 to perform signal transceiving operations) and adjusts the impedance value corresponding to the tunable matching circuit TM1 to a second impedance value (e.g., 75 Ohm), and the antenna A0 is conducted to the tunable matching circuit TM1 through the switching circuit SW1. Accordingly, when the antenna A1 transmits or receives signals, the wireless communication device 100 uses the tunable matching circuit TM1 to adjust a load impedance of the un-used antenna A0 and thereby improves performance of the in-use antenna A1. In other words, the wireless communication device 100 adjusts the load impedance of the un-used antenna through the tunable matching circuit TM1 and provides different impedance values in response to different antennas. Accordingly, impact caused by the un-used antenna on the in-use antenna is reduced, and performance of the in-use antenna is thereby improved, which enhances communication quality of the wireless communication device 100.

Referring to FIG. 1 again, the wireless communication device 100 further includes a transceiver 110, a duplexer 120, and a processing circuit 130. In an embodiment, the switching circuit SW1 has a first end 1 to a fourth end 4. The first end 1 of the switching circuit SW1 is electrically connected to the duplexer 120, the second end 2 of the switching circuit SW1 is electrically connected to the tunable matching circuit TM1, the third end 3 of the switching circuit SW1 is electrically connected to the antenna A0, and the fourth end 4 of the switching circuit SW1 is electrically connected to the antenna A1. A receiving end Rx and a transmitting end Tx of the transceiver 110 are electrically connected to the duplexer 120. The processing circuit 130 is electrically connected to the transceiver 110, the tunable matching circuit TM1, and the switching circuit SW1. Transceiver 110 may have a RF front end circuit for transceiving signals.

In the first operation mode, the processing circuit 130 controls the switching circuit SW1 by using a control signal CT1 to cause the first end 1 and the third end 3 of the switching circuit SW1 to be electrically connected to each other and cause the second end 2 and the fourth end 4 of the switching circuit SW1 to be electrically connected to each other. Moreover, the duplexer 120 conducts the first end 1 of the switching circuit SW1 to the receiving end Rx or the transmitting end Tx of the transceiver 110. Accordingly, the receiving end Rx or the transmitting end Tx of the transceiver 110 is conducted to the antenna A0 through the duplexer 120 and the switching circuit SW1 to transmit or receive signals through the antenna A0. Meanwhile, the processing circuit 130 controls the tunable matching circuit TM1 by using an adjustment signal S1 to cause the impedance value corresponding to the tunable matching circuit TM1 to have a first impedance value, and moreover, the antenna A1 is conducted to the tunable matching circuit TM1 having the first impedance value through the switching circuit SW1 to reduce the impact on the antenna A0 which is being used (or being operated).

In the second operation mode, the processing circuit 130 also respectively controls the switching circuit SW1 and the tunable matching circuit TM1 by using the control signal CT1 and the adjustment signal S1. Under control of the processing circuit 130, the first end 1 and the fourth end 4 of the switching circuit SW1 are electrically connected to each other, the second end 2 and the third end 3 of the switching circuit SW1 are electrically connected to each other, and the impedance value corresponding to the tunable matching circuit TM1 is adjusted to the second impedance value. Accordingly, the transceiver 110 transmits or receives signals through the antenna A1, and the antenna A0 is conducted to the tunable matching circuit TM1 having the second impedance value through the switching circuit SW1 to reduce the impact on the antenna A1 which is being used (or being operated).

It is noted that prior to entering the first operation mode or the second operation mode, the wireless communication device 100 dynamically adjusts the impedance value corresponding to the tunable matching circuit TM1 to select the first impedance value or the second impedance value among a plurality of predetermined impedance values. For example, prior to entering the first operation mode, the wireless communication device 100 is switched to a first setting mode. In the first setting mode, the receiving end Rx of the transceiver 110 is conducted to the antenna A0 through the duplexer 120 and the switching circuit SW1 to receive signals through the antenna A0. Moreover, the antenna A1 is conducted to the tunable matching circuit TM1 through the switching circuit SW1, and the processing circuit 130 sequentially adjusts the impedance value corresponding to the tunable matching circuit TM1 according to the plurality of predetermined impedance values. Specifically, the processing circuit 130 selects the predetermined impedance values one by one, and sequentially adjusts the impedance value corresponding to the tunable matching circuit TM1 to the selected predetermined impedance value. In addition, each time the impedance value corresponding to the tunable matching circuit TM1 is adjusted once, the processing circuit 130 obtains a corresponding first received signal strength indicator (RSSI) value according to the signal(s) received by the antenna A0.

In other words, in the first setting mode, the processing circuit 130 adjusts the impedance value corresponding to the tunable matching circuit TM1 to the plurality of predetermined impedance values, and obtains a plurality of first RSSI values corresponding to the plurality of predetermined impedance values through the antenna A0. Moreover, the processing circuit 130 selects the first impedance value among the plurality of predetermined impedance values according to the plurality of first received signal strength indicator values. For example, the processing circuit 130 selects an optimal first RSSI value among the plurality of first RSSI values, and sets the predetermined impedance value corresponding to the optimal first RSSI value as the first impedance value. Accordingly, when the wireless communication device 100 enters the first operation mode, the wireless communication device 100 can adjust the impedance value corresponding to the tunable matching circuit TM1 according to the first impedance value obtained in the first setting mode.

Similarly, prior to entering the second operation mode, the wireless communication device 100 is switched to a second setting mode. In the second setting mode, the receiving end Rx of the transceiver 110 is conducted to the antenna A1 through the duplexer 120 and the switching circuit SW1 to receive signals through the antenna A1. The antenna A0 is conducted to the tunable matching circuit TM1 through the switching circuit SW1. Moreover, the processing circuit 130 adjusts the impedance value corresponding to the tunable matching circuit TM1 to the plurality of predetermined impedance values, and obtains a plurality of second RSSI values corresponding to the plurality of predetermined impedance values through the antenna A1. The processing circuit 130 further selects the second impedance value among the plurality of predetermined impedance values according to the plurality of second RSSI values. Accordingly, when the wireless communication device 100 enters the second operation mode, the wireless communication device 100 can adjust the impedance value corresponding to the tunable matching circuit TM1 according to the second impedance value obtained in the second setting mode.

It is noted that, in another embodiment, the wireless communication device 100 may also directly obtain the first impedance value and the second impedance value through looking up in a table. For example, the wireless communication device 100 further includes a storage circuit 140. Specifically, the storage circuit 140 stores a lookup table, and the lookup table records the first impedance value corresponding to the antenna A1 and the second impedance value corresponding to the antenna A0. In the first operation mode, the processing circuit 130 looks up in the stored lookup table in response to the un-used antenna A1 to obtain the first impedance value. Furthermore, in the second operation mode, the processing circuit 130 looks up in the stored lookup table in response to the un-used antenna A0 to obtain the second impedance value.

The embodiment of FIG. 1 illustrates an implementation where a single switching circuit is used to switch between two antennas, but the invention is not limited hereto. In another embodiment, the wireless communication device may also use N switching circuits to switch among (N+1) antennas, and N tunable matching circuits may be correspondingly disposed to improve the performance of the in-use antenna, wherein N is an integer equal to or greater than 2.

Figure 2:
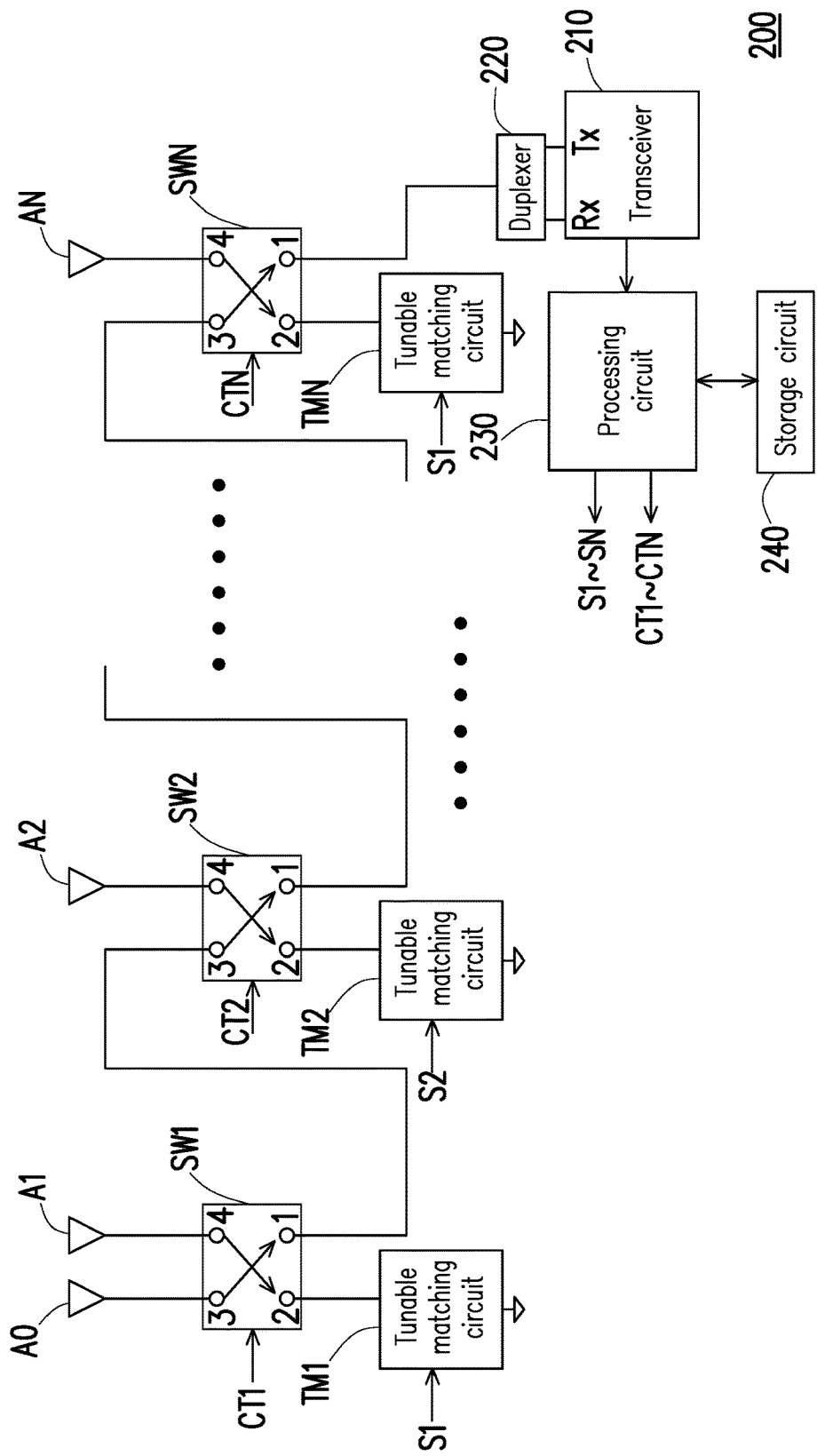
FIG. 2 is a schematic diagram illustrating a wireless communication device according to another embodiment of the invention.

For example, FIG. 2 is a schematic diagram illustrating a wireless communication device according to another embodiment of the invention. As shown in FIG. 2, a wireless communication device 200 includes $1^{st}$ to $N^{th}$ switching circuits SW1 to SWN, $1^{st}$ to $(N+1)^{th}$ antennas A0 to AN, $1^{st}$ to $N^{th}$ tunable matching circuits TM1 to TMN, a transceiver 210, a duplexer 220, a processing circuit 230, and a storage circuit 240, wherein N is an integer equal to or greater than 2. Specifically, the N switching circuits SW1 to SWN are double pole double throw (DPDT) radio frequency switches and each have a first end 1 to a fourth end 4. Reference may be made to the embodiment of FIG. 1 for connection structures among the switching circuit SW1, the antennas A0 to A1, and the tunable matching circuit TM1. The third end 3 of the switching circuit SW2 is electrically connected to the first end 1 of the switching circuit SW1, the second end 2 of the switching circuit SW2 is electrically connected to the tunable matching circuit TM2, and the fourth end 4 of the switching circuit SW2 is electrically connected to the antenna A2.

Analogously, the third end of the $(i)^{th}$ switching circuit is electrically connected to the first end of the $(i-1)^{th}$ switching circuit, the second end of the $(i)^{th}$ switching circuit is electrically connected to the $(i)^{th}$ tunable matching circuit, and the fourth end of the $(i)^{th}$ switching circuit is electrically connected to the $(i+1)^{th}$ antenna, wherein i is an integer and $2 \leq i \leq N$. Moreover, the duplexer 220 is electrically connected to the first end 1 of the switching circuit SWN and conducts the first end 1 of the switching circuit SWN to a receiving end Rx or a transmitting end Tx of the transceiver 210. The processing circuit 230 is electrically connected to the transceiver 210, and the processing circuit 230 controls the N switching circuits SW1 to SWN by using N control signals CT1 to CTN, and controls the N tunable matching circuits TM1 to TMN by using N adjustment signals S1 to SN.

In a first operation mode, the wireless communication device 200 uses the antenna A0 to perform signal transmission or reception, and the wireless communication device 200 uses the N tunable matching circuits TM1 to TMN to adjust load impedances of the un-used N antennas A1 to AN. In a second operation mode, the wireless communication device 200 uses the antenna A1 to perform signal transmission or reception, and the wireless communication device 200 uses the N tunable matching circuits TM1 to TMN to adjust load impedances of the un-used N antennas A0, A2 to AN. Specifically, in the first operation mode and the second operation mode, reference may be made to the embodiment of FIG. 1 for a switching mechanism of the first end 1 to the fourth end 4 of the switching circuit SW1. Moreover, in the first operation mode and the second operation mode, the first end and the third end of each of the switching circuits SW2 to SWN are electrically connected to each other, and the second end and the fourth end of each of the switching circuits SW2 to SWN are electrically connected to each other.

Analogously, the wireless communication device 200 includes (N+1) operation modes, and in the $(j)^{th}$ operation mode, the wireless communication device 200 uses the $(j)^{th}$ antenna to perform signal transmission or reception, and the wireless communication device 200 uses the N tunable matching circuits TM1 to TMN to adjust load impedances of the rest of the un-used N antennas, wherein j is an integer and $1 \leq j \leq (N+1)$. For example, when N=2, the wireless communication device 200 further includes a third operation mode. In the third operation mode, the first end 1 and the fourth end 4 of each of the switching circuit SW1 and the switching circuit SW2 are electrically connected to each other, and the second end 2 and the third end 3 of each of the switching circuit SW1 and the switching circuit SW2 are electrically connected to each other.

Accordingly, in the third operation mode, the antenna A2 is conducted to the receiving end Rx or the transmitting end Tx of the transceiver 210 through the switching circuit SW2 and the duplexer 220 to enable the wireless communication device 200 to use the antenna A2 to transmit or receive signals. Moreover, the antenna A0 is conducted to the tunable matching circuit TM1 through the switching circuit SW1, and the antenna A1 is conducted to the tunable matching circuit TM2 through the switching circuit SW1 and the switching circuit SW2. In other words, the wireless communication device 200 adjusts the load impedances of the un-used antennas A0 and A1 through the tunable matching circuits TM1 and TM2. Accordingly, impact caused by the un-used antennas A0 and A1 on the in-use antenna A2 is reduced, and performance of the in-use antenna A2 is thereby improved, which enhances communication quality of the wireless communication device 200.

In addition, similar to the embodiment of FIG. 1, prior to entering the $(j)^{th}$ operation mode, the wireless communication device 200 first enters a $(j)^{th}$ setting mode. Moreover, in the $(j)^{th}$ setting mode, the wireless communication device 200 dynamically adjusts the impedance values corresponding to the N tunable matching circuits TM1 to TMN to obtain the N impedance values corresponding to the N tunable matching circuits TM1 to TMN in the $(j)^{th}$ operation mode. Accordingly, when the wireless communication device 200 enters the $(j)^{th}$ operation mode, the wireless communication device 200 can set the impedance values corresponding to the N tunable matching circuits TM1 to TMN according to the N impedance values obtained in the $(j)^{th}$ setting mode.

Similar to the embodiment of FIG. 1, in another embodiment, the wireless communication device 200 may also directly obtain the N impedance values corresponding to the N tunable matching circuits TM1 to TMN in the $(j)^{th}$ operation mode through looking up in a table. For example, the storage circuit 240 stores a lookup table, and the lookup table records the N impedance values corresponding to the N tunable matching circuits TM1 to TMN in each operation mode. Accordingly, in the $(j)^{th}$ operation mode, the processing circuit 230 looks up in the stored lookup table in response to the un-used N antennas to obtain the impedance values respectively corresponding to the N tunable matching circuits TM1 to TMN.

Figure 3:
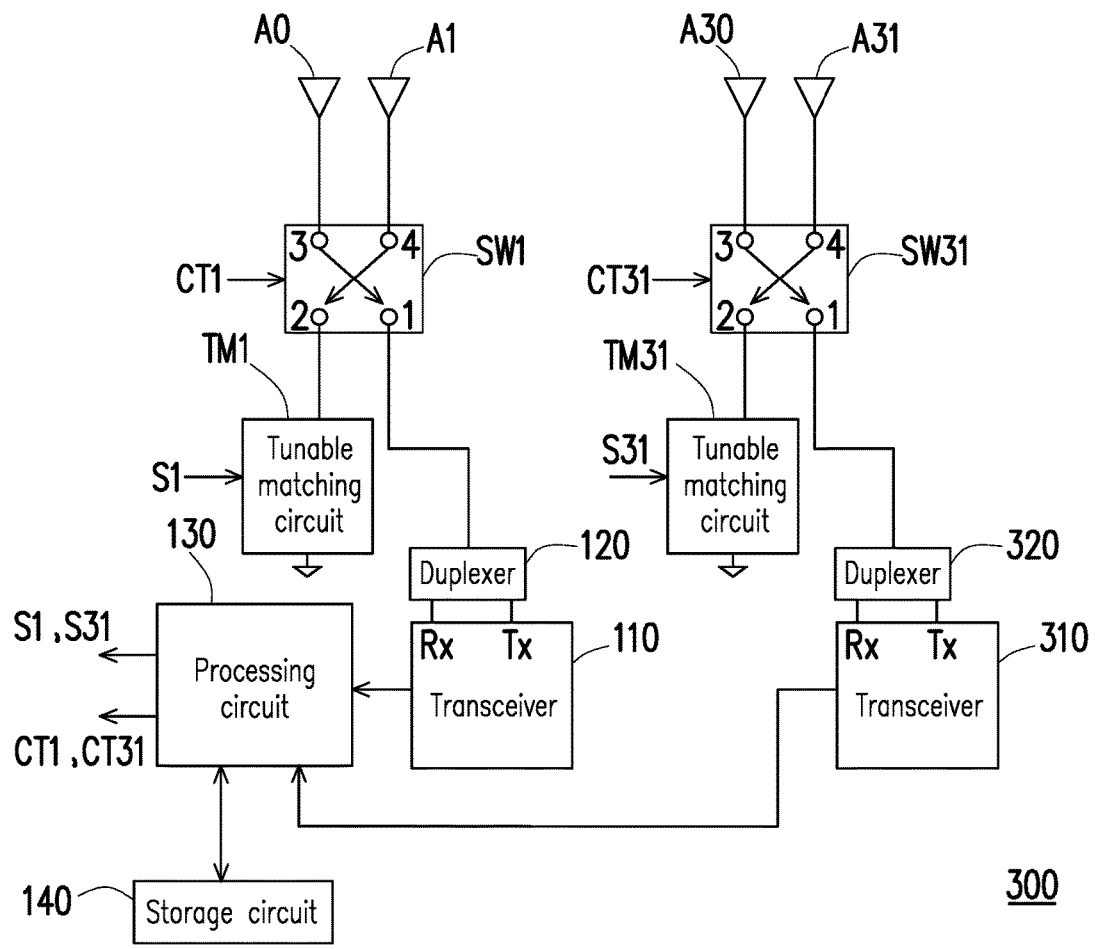
FIG. 3 is a schematic diagram illustrating a wireless communication device according to another embodiment of the invention.

FIG. 3 is a schematic diagram illustrating a wireless communication device according to another embodiment of the invention. Compared to the embodiment of FIG. 1, a wireless communication device 300 of FIG. 3 further includes a switching circuit SW31, antennas A30 and A31, a tunable matching circuit TM31, a transceiver 310, and a duplexer 320. Specifically, the switching circuit SW3 has a first end 1 to a fourth end 4. The duplexer 320 is electrically connected to the first end 1 of the switching circuit SW31. The tunable matching circuit TM31 is electrically connected to the second end 2 of the switching circuit SW31. The antenna A30 is electrically connected to the third end 3 of the switching circuit SW31. The antenna A31 is electrically connected to the fourth end 4 of the switching circuit SW31. Moreover, the transceiver 310 and the transceiver 110 in FIG. 3 share the same processing circuit 130. In another embodiment, the wireless communication device 300 of FIG. 3 may also be provided with two independent processing circuits for respective use of the transceiver 310 and the transceiver 110.

In operation, the processing circuit 130 respectively controls the switching circuit SW31 and the tunable matching circuit TM31 by using a control signal CT31 and an adjustment signal S31, and the duplexer 320 conducts the first end 1 of the switching circuit SW31 to a receiving end Rx or a transmitting end Tx of the transceiver 310. Moreover, operation mechanisms of the switching circuit SW31, the antennas A30 and A31, the tunable matching circuit TM31, the transceiver 310, and the duplexer 320 are similar to operation mechanisms of the switching circuit SW1, the antennas A0 and A1, the tunable matching circuit TM1, the transceiver 110, and the duplexer 120.

For example, when the transceiver 310 uses the antenna A30 to perform signal transmission or reception, the third end 3 and the first end 1 of the switching circuit SW31 are electrically connected to each other, and the fourth end 4 and the second end 2 of the switching circuit SW31 are electrically connected to each other. Accordingly, the antenna A30 is conducted to the receiving end Rx or the transmitting end Tx of the transceiver 310 through the switching circuit SW31 and the duplexer 320, and the antenna A31 is conducted to the tunable matching circuit TM31 through the switching circuit SW31. Moreover, the wireless communication device 300 adjusts a load impedance of the un-used antenna A31 through the tunable matching circuit TM31 to reduce impact caused by the un-used antenna A31 on the in-use antenna A30.

On the other hand, when the transceiver 310 uses the antenna A31 to perform signal transmission or reception, the third end 3 and the second end 2 of the switching circuit SW31 are electrically connected to each other, and the fourth end 4 and the first end 1 of the switching circuit SW31 are electrically connected to each other. Accordingly, the antenna A31 is conducted to the receiving end Rx or the transmitting end Tx of the transceiver 310 through the switching circuit SW31 and the duplexer 320, and the antenna A30 is conducted to the tunable matching circuit TM31 through the switching circuit SW31. Moreover, the wireless communication device 300 adjusts a load impedance of the un-used antenna A30 through the tunable matching circuit TM31 to reduce impact caused by the un-used antenna A30 on the in-use antenna A31.

In addition, in an embodiment, the wireless communication device 300 supports the same wireless communication system, and the antennas A0, A1, A30, and A31 support the same communication system which operates the same operational frequency band (e.g., WiFi frequency band), such that the wireless communication device 300 can support 2×2 multi-input multi-output (MIMO) techniques. In another embodiment, the antennas A0 and A1 may cover a first operational frequency band (e.g., WiFi frequency band), and the antennas A30 and A31 may cover a second operational frequency band (e.g., Bluetooth frequency band) different from the first operational frequency band to enable the wireless communication device 300 to support different wireless communication systems. The detailed configurations and operations of the components in the embodiment of FIG. 3 are already included in the embodiment of FIG. 1 and are thus not repeatedly described here. In addition, transceiver 110 and transceiver 310 may be integrated into one transceiver having two RF front end circuits. Please note that the duplexer 120 and duplexer 320 may not be required in WiFi communication system, instead, T/R switch may be required.

Figure 4:
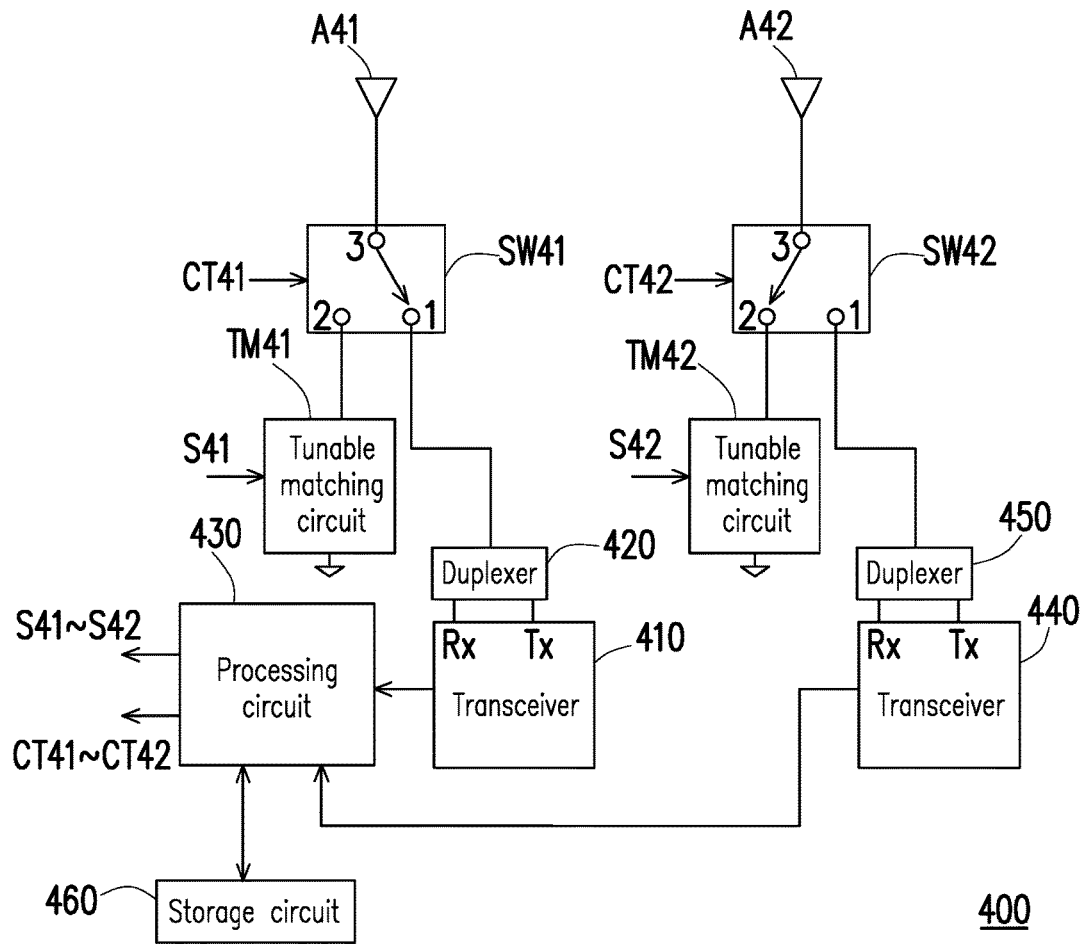
FIG. 4 is a schematic diagram illustrating a wireless communication device according to another embodiment of the invention.

For example, FIG. 4 is a schematic diagram illustrating a wireless communication device according to another embodiment of the invention. In this embodiment, the antennas A0 and A1 may respectively cover different operational frequency bands and may respectively correspond to different transceivers to enable the wireless communication device to support different wireless communication systems by using the antennas A0 and A1. As shown in FIG. 4, a wireless communication device 400 includes switching circuits SW41 and SW42, antennas A41 and A42, tunable matching circuits TM41 and TM42, transceivers 410 and 440, duplexers 420 and 450, a processing circuit 430, and a storage circuit 460. Specifically, the transceivers 410 and 440 share the same processing circuit 430. In another embodiment, the wireless communication device 400 of FIG. 4 may also be provided with two independent processing circuits for respective use of the transceivers 410 and 440. Moreover, the switching circuits SW41 and SW42 are, for example, single pole double throw (SPDT) radio frequency switches and respectively have a first end 1 to a third end 3.

In overall configuration, the first end 1 to the third end 3 of the switching circuit SW41 are respectively electrically connected to the duplexer 420, the tunable matching circuit TM41, and the antenna A41; and the first end 1 to the third end 3 of the switching circuit SW42 are respectively electrically connected to the duplexer 450, the tunable matching circuit TM42, and the antenna A42. Moreover, the duplexer 420 conducts the first end 1 of the switching circuit SW41 to a receiving end Rx or a transmitting end Tx of the transceiver 410, and the duplexer 450 conducts the first end 1 of the switching circuit SW42 to a receiving end Rx or a transmitting end Tx of the transceiver 440. The processing circuit 430 is electrically connected to the transceiver 410, the transceiver 440, and the storage circuit 460. Moreover, the processing circuit 430 controls the switching circuits SW41 to SW42 by using control signals CT41 to CT42, and controls the tunable matching circuits TM41 to TM42 by using adjustment signals S41 to S42.

In a first operation mode, the wireless communication device 400 uses the antenna A41 to perform signal transmission or reception and adjusts an impedance value corresponding to the tunable matching circuit TM42 to a first impedance value, and the antenna A42 is conducted to the tunable matching circuit TM42 through the switching circuit SW42. Specifically, under control of the processing circuit 430, the third end 3 and the first end 1 of the switching circuit SW41 are electrically connected to each other, and the third end 3 and the second end 2 of the switching circuit SW42 are electrically connected to each other. Accordingly, the receiving end Rx or the transmitting end Tx of the transceiver 410 is conducted to the antenna A41 through the duplexer 420 and the switching circuit SW41 to cover a first operational frequency band (e.g., LTE frequency band) through the antenna A41. On the other hand, the processing circuit 430 controls the tunable matching circuit TM42 by using the adjustment signal S42 to cause the tunable matching circuit TM42 to have the first impedance value. Moreover, the antenna A42 is conducted to the tunable matching circuit TM42 having the first impedance value through the switching circuit SW42 to reduce the impact on the antenna A41 which is being used (or being operated).

In a second operation mode, the wireless communication device 400 uses the antenna A42 to perform signal transmission or reception and adjusts the tunable matching circuit TM41 to a second impedance value, and the antenna A41 is conducted to the tunable matching circuit TM41 through the switching circuit SW41. Specifically, under control of the processing circuit 430, the third end 3 and the second end 2 of the switching circuit SW41 are electrically connected to each other, and the third end 3 and the first end 1 of the switching circuit SW42 are electrically connected to each other. Accordingly, the receiving end Rx or the transmitting end Tx of the transceiver 440 is conducted to the antenna A42 through the duplexer 450 and the switching circuit SW42 to cover a second operational frequency band (e.g., WiFi frequency band) through the antenna A42. On the other hand, the processing circuit 430 controls the tunable matching circuit TM41 by using the adjustment signal S41 to cause the tunable matching circuit TM41 to have the second impedance value. Moreover, the antenna A41 is conducted to the tunable matching circuit TM41 having the second impedance value through the switching circuit SW41 to reduce the impact on the antenna A42 which is being used (or being operated). In other words, the wireless communication device 400 covers the first operational frequency band (e.g., LTE frequency band) in the first operation mode by using the antenna A41, and covers the second operational frequency band (e.g., WiFi frequency band) in the second operation mode by using the antenna A42, which enables the wireless communication device 400 to support different wireless communication systems.

Similar to the embodiment of FIG. 1, prior to entering the first operation mode, the wireless communication device 400 is switched to a first setting mode. In the first setting mode, the processing circuit 430 sequentially adjusts the impedance value corresponding to the tunable matching circuit TM42 to a plurality of predetermined impedance values, and obtains a plurality of first RSSI values corresponding to the plurality of predetermined impedance values through the antenna A41. Moreover, the processing circuit 430 selects the first impedance value among the plurality of predetermined impedance values according to the plurality of first RSSI values. Similarly, before prior to the second operation mode, the wireless communication device 400 is first switched to a second setting mode. In the second setting mode, the processing circuit 430 sequentially adjusts the impedance value corresponding to the tunable matching circuit TM41 to the plurality of predetermined impedance values, and obtains a plurality of second RSSI values corresponding to the plurality of predetermined impedance values through the antenna A42. Moreover, the processing circuit 430 selects the second impedance value among the plurality of predetermined impedance values according to the plurality of second RSSI values.

Similar to the embodiment of FIG. 1, in another embodiment, the wireless communication device 400 may also directly obtain the first impedance value and the second impedance value through looking up in a table. For example, the storage circuit 460 stores a lookup table, and the lookup table includes the first impedance value corresponding to the antenna A42 and the second impedance value corresponding to the antenna A41. In the first operation mode, the processing circuit 430 looks up in the stored lookup table in response to the un-used antenna A42 to obtain the first impedance value. Conversely, in the second operation mode, the processing circuit 430 looks up in the stored lookup table in response to the un-used antenna A41 to obtain the second impedance value.

It is noted that the tunable matching circuits TM1 to TMN, TM31, TM41, and TM42 in the embodiments of FIG. 1 to FIG. 4 have the same or similar circuit structures, and, in hereby the tunable matching circuit TM1 is taken as an example to further describe the circuit structure of the above-mentioned tunable matching circuit(s).

Figure 5:
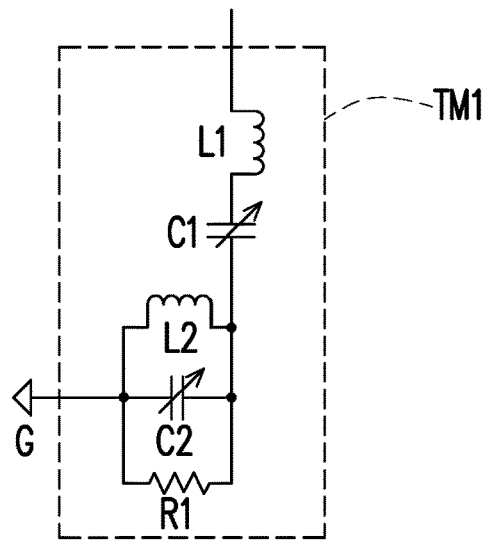
FIG. 5 is a circuit diagram illustrating a tunable matching circuit according to an embodiment of the invention.
Figure 6:
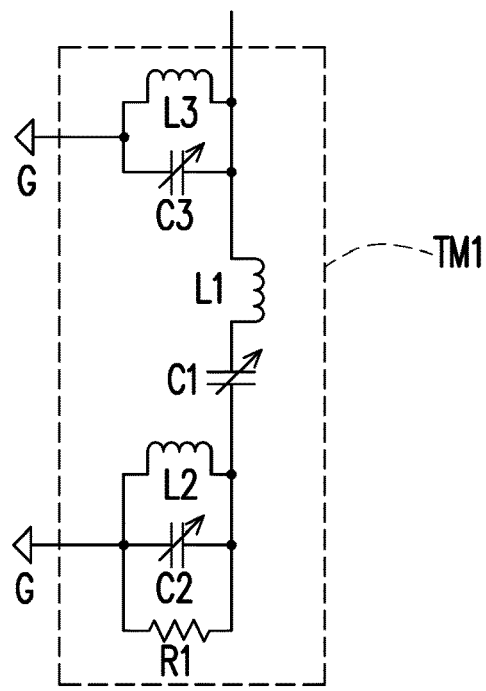
FIG. 6 is a circuit diagram illustrating a tunable matching circuit according to another embodiment of the invention.

For example, FIG. 5 is a circuit diagram illustrating a tunable matching circuit according to an embodiment of the invention. As shown in FIG. 5, the tunable matching circuit TM1 includes inductors L1 to L2, variable capacitors C1 to C2, and a resistor R1. Specifically, a first end of the inductor L1 is electrically connected to the switching circuit SW1. A first end of the variable capacitor C1 is electrically connected to a second end of the inductor L1. The inductor L2 is electrically connected between a second end of the variable capacitor C1 and a grounding end G. The variable capacitor C2, the inductor L2, and the resistor R1 are connected in parallel with each other. In operation, the processing circuit 130 controls capacitance values of the variable capacitors C1 to C2 through the adjustment signal S1 to thereby change the impedance value of the tunable matching circuit TM1. FIG. 6 is a circuit diagram illustrating a tunable matching circuit according to another embodiment of the invention. Compared to the embodiment of FIG. 5, the tunable matching circuit TM1 of FIG. 6 further includes an inductor L3 and a variable capacitor C3. Specifically, the inductor L3 is electrically connected between the first end of the inductor L1 and the grounding end G. The variable capacitor C3 is connected in parallel with the inductor L3. Moreover, the processing circuit 130 further controls a capacitance value of the variable capacitor C3 through the adjustment signal S1.

In summary of the above, the wireless communication device of the embodiments of the invention uses the switching circuit(s) to select part of the antennas for use, and uses the tunable matching circuit(s) to adjust the load impedance(s) of the un-used antenna(s). Accordingly, impact caused by the un-used antenna(s) on the in-use antenna is reduced, and performance of the in-use antenna is thereby improved, which enhances communication quality of the wireless communication device.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A wireless communication device comprising:
   a first antenna;
   a second antenna;
   a first switching circuit electrically connected to the first antenna and the second antenna; and
   a first tunable matching circuit electrically connected to the first switching circuit,
   wherein in a first operation mode, the first antenna of the wireless communication device performs signal transmission or reception, an impedance value corresponding to the first tunable matching circuit is adjusted to a first impedance value, and the second antenna is conducted to the first tunable matching circuit through the first switching circuit, and
   wherein in a second operation mode, the second antenna of the wireless communication device performs signal transmission or reception, the impedance value corresponding to the first tunable matching circuit is adjusted to a second impedance value, and the first antenna is conducted to the first tunable matching circuit through the first switching circuit.

2. The wireless communication device according to claim 1, further comprising a processing circuit, wherein prior to entering the first operation mode, the wireless communication device is switched to a first setting mode, and in the first setting mode, the processing circuit adjusts the impedance value corresponding to the first tunable matching circuit to a plurality of predetermined impedance values, obtains a plurality of first received signal strength indicator (RSSI) values corresponding to the predetermined impedance values through the first antenna, and selects the first impedance value among the predetermined impedance values according to the first RSSI values.

3. The wireless communication device according to claim 2, wherein prior to entering the second operation mode, the wireless communication device is switched to a second setting mode, and in the second setting mode, the processing circuit adjusts the impedance value corresponding to the first tunable matching circuit to the predetermined impedance values, obtains a plurality of second RSSI values corresponding to the predetermined impedance values through the second antenna, and selects the second impedance value among the predetermined impedance values according to the second RSSI values.

4. The wireless communication device according to claim 1, further comprising a processing circuit and a storage circuit, wherein the storage circuit stores a lookup table, and the lookup table comprises the first impedance value and the second impedance value, and the processing circuit looks up in the lookup table to obtain the first impedance value and the second impedance value.

5. The wireless communication device according to claim 1, wherein the first switching circuit has a first end to a fourth end, the second end of the first switching circuit is electrically connected to the first tunable matching circuit, the third end of the first switching circuit is electrically connected to the first antenna, and the fourth end of the first switching circuit is electrically connected to the second antenna, wherein in the first operation mode, the first end and the third end of the first switching circuit are electrically connected to each other, and the second end and the fourth end of the first switching circuit are electrically connected to each other, and in the second operation mode, the first end and the fourth end of the first switching circuit are electrically connected to each other, and the second end and the third end of the first switching circuit are electrically connected to each other.

6. The wireless communication device according to claim 5, further comprising:
   a first transceiver; and
   a processing circuit electrically connected to the first transceiver, the first tunable matching circuit, and the first switching circuit, wherein the processing circuit controls the first tunable matching circuit and the first switching circuit.

7. The wireless communication device according to claim 6, further comprising:
   a second transceiver;
   a second switching circuit having a first end to a fourth end and controlled by the processing circuit;
   a second tunable matching circuit electrically connected to the second end of the second switching circuit and controlled by the processing circuit;
   a third antenna electrically connected to the third end of the second switching circuit; and
   a fourth antenna electrically connected to the fourth end of the second switching circuit, wherein when the second transceiver uses the third antenna to perform signal transmission or reception, the third end and the first end of the second switching circuit are electrically connected to each other, and the fourth end and the second end of the second switching circuit are electrically connected to each other, and when the second transceiver uses the fourth antenna to perform signal transmission or reception, the third end and the second end of the second switching circuit are electrically connected to each other, and the fourth end and the first end of the second switching circuit are electrically connected to each other.

8. The wireless communication device according to claim 5, further comprising:
   a second switching circuit having a first end to a fourth end, wherein the third end of the second switching circuit is electrically connected to the first end of the first switching circuit;
   a second tunable matching circuit electrically connected to the second end of the second switching circuit; and a third antenna electrically connected to the fourth end of the second switching circuit, wherein in the first operation mode and the second operation mode, the first end and the third end of the second switching circuit are electrically connected to each other, and the second end and the fourth end of the second switching circuit are electrically connected to each other, and in a third operation mode, the wireless communication device uses the third antenna to perform signal transmission or reception, the first antenna is conducted to the first tunable matching circuit through the first switching circuit, and the second antenna is conducted to the second tunable matching circuit through the first switching circuit and the second switching circuit.

9. The wireless communication device according to claim 8, further comprising:

a transceiver; and a processing circuit electrically connected to the transceiver and controlling the first switching circuit, the first tunable matching circuit, the second switching circuit, and the second tunable matching circuit.

10. The wireless communication device according to claim 8, wherein in the third operation mode, the first end and the fourth end of the first switching circuit are electrically connected to each other, the second end and the third end of the first switching circuit are electrically connected to each other, the first end and the fourth end of the second switching circuit are electrically connected to each other, and the second end and the third end of the second switching circuit are electrically connected to each other.

11. The wireless communication device according to claim 1, wherein the first tunable matching circuit comprises:

a first inductor having a first end electrically connected to the first switching circuit;

a first variable capacitor having a first end electrically connected to a second end of the first inductor;

a second inductor electrically connected between a second end of the first variable capacitor and a grounding end;

a second variable capacitor connected in parallel with the second inductor; and a resistor connected in parallel with the second variable capacitor.

12. The wireless communication device according to claim 11, wherein the first tunable matching circuit further comprises:

a third inductor electrically connected between the first end of the first inductor and the grounding end; and a third variable capacitor connected in parallel with the third inductor.

13. A wireless communication device comprising:

a first switching circuit;

a first antenna electrically connected to the first switching circuit;

a first tunable matching circuit electrically connected to the first switching circuit;

a second switching circuit;

a second antenna electrically connected to the second switching circuit; and a second tunable matching circuit electrically connected to the second switching circuit, wherein in a first operation mode, the first antenna of the wireless communication device performs signal transmission or reception, an impedance value corresponding to the second tunable matching circuit is adjusted to a first impedance value, and the second antenna is conducted to the second tunable matching circuit through the second switching circuit, and in a second operation mode, the second antenna of the wireless communication device performs signal transmission or reception, an impedance value corresponding to the first tunable matching circuit is adjusted to a second impedance value, and the first antenna is conducted to the first tunable matching circuit through the first switching circuit.

14. The wireless communication device according to claim 13, further comprising:

a processing circuit, wherein prior to entering the first operation mode, the wireless communication device is switched to a first setting mode, and in the first setting mode, the processing circuit adjusts the impedance value corresponding to the second tunable matching circuit to a plurality of predetermined impedance values, obtains a plurality of first received signal strength indicator (RSSI) values corresponding to the predetermined impedance values through the first antenna, and selects the first impedance value among the predetermined impedance values according to the first RSSI values, wherein prior to entering the second operation mode, the wireless communication device is switched to a second setting mode, and in the second setting mode, the processing circuit adjusts the impedance value corresponding to the first tunable matching circuit to the predetermined impedance values, obtains a plurality of second RSSI values corresponding to the predetermined impedance values through the second antenna, and selects the second impedance value among the predetermined impedance values according to the second RSSI values.

15. The wireless communication device according to claim 13, further comprising a processing circuit and a storage circuit, wherein the storage circuit stores a lookup table, and the lookup table comprises the first impedance value and the second impedance value, wherein the processing circuit looks up in the lookup table to obtain the first impedance value and the second impedance value.

16. The wireless communication device according to claim 13, wherein the first switching circuit has a first end to a third end, the first antenna is electrically connected to the third end of the first switching circuit, the first tunable matching circuit is electrically connected to the second end of the first switching circuit, and the wireless communication device further comprises:

a first transceiver; and a processing circuit electrically connected to the first transceiver and controlling the first switching circuit, the first tunable matching circuit, the second switching circuit, and the second tunable matching circuit, wherein in the first operation mode, the third end and the first end of the first switching circuit are electrically connected to each other, and in the second operation mode, the third end and the second end of the first switching circuit are electrically connected to each other.

17. The wireless communication device according to claim 16, wherein the second switching circuit has a first end to a third end, the second antenna is electrically connected to the third end of the second switching circuit, the second tunable matching circuit is electrically connected to the second end of the second switching circuit, and the wireless communication device further comprises:

a second transceiver electrically connected to the processing circuit;

wherein in the first operation mode, the third end and the second end of the second switching circuit are electrically connected to each other, and in the second operation mode, the third end and the first end of the second switching circuit are electrically connected to each other.

18. The wireless communication device according to claim 13, wherein the first tunable matching circuit comprises:

a first inductor having a first end electrically connected to the first switching circuit;

a first variable capacitor having a first end electrically connected to a second end of the first inductor;

a second inductor electrically connected between a second end of the first variable capacitor and a grounding end;

a second variable capacitor connected in parallel with the second inductor; and a resistor connected in parallel with the second variable capacitor.

19. The wireless communication device according to claim 18, wherein the first tunable matching circuit further comprises:

a third inductor electrically connected between the first end of the first inductor and the grounding end; and a third variable capacitor connected in parallel with the third inductor.

* * * * *